United States Patent [19]

Berger et al.

[11] Patent Number: 4,796,560
[45] Date of Patent: Jan. 10, 1989

[54] AUTOMATIC SOLDER PASTE APPLICATION TO CIRCUIT BOARDS

[75] Inventors: Jean P. Berger, Raleigh; Evans H. Pridgen, Pittsboro; Alfred W. Owens, Raleigh, all of N.C.

[73] Assignee: Northern Telecom Limited, Montreal, Canada

[21] Appl. No.: 217,031

[22] Filed: Jul. 11, 1988

Related U.S. Application Data

[60] Continuation of Ser. No. 63,790, Jun. 22, 1987, abandoned, which is a division of Ser. No. 681,265, Dec. 13, 1984, Pat. No. 4,704,305, which is a continuation-in-part of Ser. No. 586,807, Mar. 6, 1984, abandoned.

[51] Int. Cl.⁴ .................................................. B05C 1/02
[52] U.S. Cl. ..................................... 118/211; 118/225; 118/243
[58] Field of Search ............... 118/243, 263, 211, 225; 228/33

[56] References Cited

U.S. PATENT DOCUMENTS 3,604,391  9/1971  Mallia et al. .................. 118/243 X
4,273,607  6/1981  Paul ................................. 118/263 X

FOREIGN PATENT DOCUMENTS 2719945  11/1978  Fed. Rep. of Germany ...... 118/243
1099650  1/1968  United Kingdom .
2138339A  10/1984  United Kingdom .

Primary Examiner—John McIntosh
Attorney, Agent, or Firm—Foley & Lardner, Schwartz, Jeffery, Schwaab, Mack, Blumenthal & Evans

[57] ABSTRACT

Solder paste is automatically applied to circuit boards, in predetermined amounts at predetermined positions by providing a plurality of holes in a nylon, "Delrin," "Teflon" or other plastic-metal plate, the holes being in a predetermined pattern, filling solder paste into the holes which are facing in an upward direction pivoting the plate over the circuit board, and ejecting the solder paste onto a circuit board. Conveniently the solder paste is ejected by pins mounted on a further plate and reciprocated in the holes. The position of the pins in the holes during filling determines the amount of solder paste filled into the holes.

10 Claims, 2 Drawing Sheets

AUTOMATIC SOLDER PASTE APPLICATION TO CIRCUIT BOARDS

CROSS-REFERENCE

This application is a continuation of Ser. No. 63,790, filed June 22, 1987, now abandoned, which in turn is a division of Ser. No. 681,265, filed Dec. 13, 1984, now U.S. Pat. No. 4,704,305 which in turn is a continuation-in-part of Ser. No. 586,807 filed Mar. 6, 1984, now abandoned.

FIELD OF THE INVENTION

This invention relates to the application of solder paste to circuit boards. In particular, the invention is concerned with the automatic application of predetermined amounts of solder paste at a number of predetermined positions on a circuit board at one time. The amount of solder paste applied can be controllably varied.

PRIOR ART

The evolution of compact circuit design using leadless components has given rise to complex requirements for providing specifically located dots of solder paste for attachment of such components. Application of solder paste is further complicated by the occurrence of mixed components, that is leaded components, leadless components, and other devices such as VLSIs - very large scale integrated circuits. This mix prevented the use of conventional screen printing methods and apparatus, because of protruding component leads on a surface to which it was desired to apply solder paste.

In such circumstances, it has been proposed to apply solder paste, one dot at a time, the paste being extruded from a nozzle. Because of the characteristics of solder paste, it is very difficult to get consistent amounts applied. Solder paste is thixatropic and can therefore be difficult to extrude in a consistent manner. Also air can get mixed in with the paste during application.

In our prior application the method which was disclosed had very limited efficiency and further required that the solder paste be applied in somewhat of an upward manner on the bottom of the plate.

Also cited in our prior application, were U.S. Pat. No. 3,604,391 and German Offenlegungsschrift No. 2719945. These references lack, inter alia, a plate which will prevent solder from causing damage by jamming the pins in their respective holes, and they further lack an efficient method and apparatus for applying solder paste in the pinholes.

OBJECTS AND SUMMARY OF THE INVENTION

In its broadest aspect, the invention applies solder paste, in a plurality of dots in a predetermined pattern by causing solder paste to fill a plurality of holes in a plate, and then forcing the solder paste out of the holes onto a circuit board. Conveniently, pins reciprocate in the holes in the plate. By controlling the position of the end of a pin in the hole, in the withdrawn position, the amount of solder paste pushed into the hole is controllably varied. The solder paste is ejected by reciprocation of the pin. The holes can be arranged in a predetermined pattern to suit a particular circuit board. Alternatively, the holes can be in a complete dot matrix on a predetermined spacing, and either the paste applied to the plate and holes filled via a screen printing technique, to fill only those holes necessary, or only those pins which are in holes where solder paste is required need be actuated.

The present invention takes our prior machine and automates it wherein a pad and pin holder are turned upsidedown, and a tray with a screen base is lowered in position over the pad. A conventional knife blade pushes the solder paste through the screen into the holes in the base. The screen member is then raised out of the way, and the base and pin holder rotate over and onto the printed circuit board which is passed along side the apparatus. A ram pushes the pin holder down emitting solder from the base onto the printed circuit board. The base member, being metal in our prior application now has a "Teflon" layer on the underside or the solder-base side. It would also be possible to utilize nylon, "Delrin" or other similar plastic. The pins in the retracted position remain within the "Teflon" layer and extend from the "Teflon" layer when the actuator pushes the pins outward. The "Teflon" layer material has a particular feature such that when it has holes drilled in it, the holes are in the form of a taper which forms an inherent seal around the pins to prevent the solder paste from vibrating up around the pins or because of the action of pushing solder paste into the holes and causing damage from jamming. The present invention is also easier to clean. In the present invention the pins do not come directly in contact with the printed circuit board because the board is not completely flat. Thus, about 90% of the solder paste is transferred to the printed circuit board. The pin thus squashes the paste down, and when it is retracted, there is a roughly hemispherical shaped dot with a pointed tip thereon.

In the present invention the solder receiving holes are turned upward and are contacted by the screen member. The screen member is withdrawn, the unit is rotated over the printed circuit boards, the solder is forced onto the board, and the pin holder rotates back to receive additional paste.

BRIEF DESCRIPTION OF THE DRAWINGS

The invention will be readily understood by the following description of certain embodiments, by way of example, in conjunction with the accompanying drawings, in which.

DETAILED DESCRIPTION OF THE INVENTION

Figure 1:
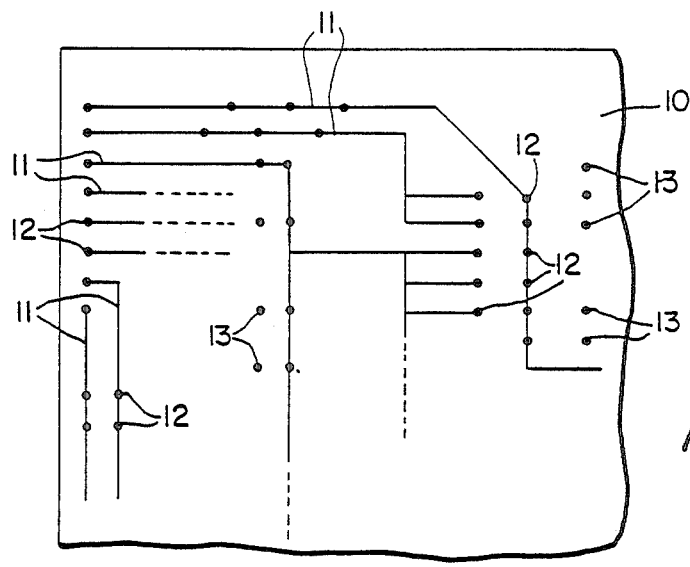
FIG. 1 is a plan view of the part of a surface of a circuit board indicating spots of solder paste.

FIG. 1 illustrates part of a circuit board 10, having circuit patterns 11 thereon. Circuit patterns are often on both sides of the board, and components can be mounted on both sides. Components may be mounted by leads passing through holes in the board and by so-called surface mounting in which components have contact areas on the bottom surface which make contact with and are soldered to contact areas on the board. Whether mounting leaded components or leadless components, it is often desired to position dots of solder paste at the solder connection positions. These are indicated at 12 and 13 in FIG. 1. Some of the dots 12 are positioned on the circuit patterns 11. Other dots 13 are positioned at holes through the board, the holes having annular contact areas around them on the surface seen in FIG. 1, but connecting with further circuit patterns on the other side of the board. Thus, holes 13 can be associated with leaded components mounted on the other side of the board 10, while dots 12 can be for surface mounting components. A similar situation of dots 12 and 13 can exist on the other side of the board 10.

Figure 2:
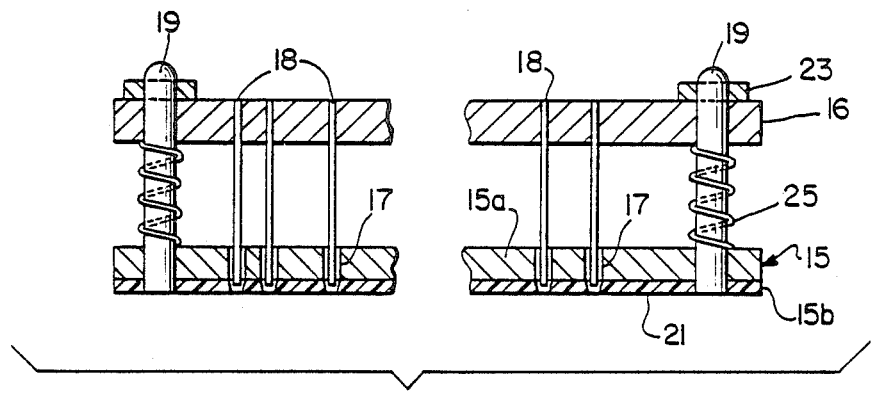
FIG. 2 is a cross-sectional view through one form of apparatus, in an initial, loading position.

FIGS. 2-7 illustrate the present invention. In the FIGURES a two part die is shown, having a lower plate 15 and an upper plate 16. The lower plate comprises two layers, a first layer 15a of appropriate metal and a second layer 15b of polytetrafluoroethylene (sold under the trademark "TEFLON") or other suitable plastic such as nylon or "Delrin." In the lower plate are formed a plurality of holes 17 and in the top plate are mounted a plurality of pins 18, a pin for each hole 17. In FIG. 2, the plates are shown in the loading or filling position, with the pins 18 extending part way down in the holes 17. The top and bottom plates can reciprocate relative to each other on guide members 19.

As will be seen in FIGS. 2-6a, the holes 17 in the "Teflon" layer 15b are slightly tapered. This is a result of the fact that when the "Teflon" material is drilled, tapered holes are formed. This creates an inherent seal around the pins to prevent the solder paste from vibrating up around the pins or because of the action of pushing solder paste into the holes and causing damage from jamming. It is also easier to clean. The sealing can best be seen in FIGS. 5 and 6 wherein the pins 18 are sealed by the "Teflon" layer, but there is still sufficient surrounding area in the metal layer.

Figure 4:
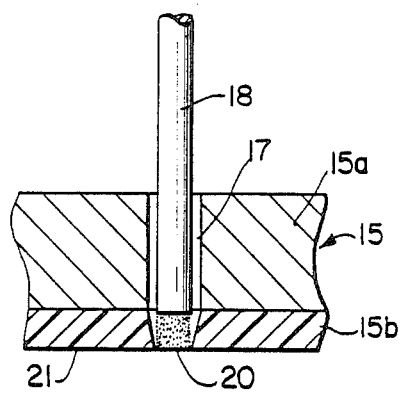
FIGS. 4, 5, 6 and 6a illustrate in a larger scale one particular pin and hole, in four positions.
Figure 5:
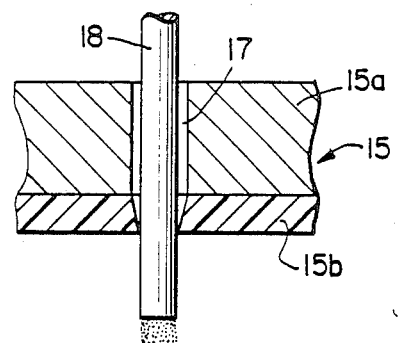

The lower parts of the holes 17, beneath the lower ends of the pins 18, have been filled with solder paste, at 20 in FIG. 4. This can readily be done by traversing a squeegee across the lower surface 21 of the lower plate as illustrated in our prior application Ser. No. 586,807. Alternatively, the filling can be accomplished in a manner shown in FIG. 7, wherein the mechanism, and particularly lower plate 15 is attached to a pivot 31 by an arm 33. The entire unit can then be rotated from the filling location at the right to the ejecting location shown by the arrows to the left of the figure where it can come in contact with the printed circuit board 10. Specifically, a tray 35 having a screen bottom 37 thereon is attached to means 39 for raising and lowering the screen. Positioned in the tray 35 is a conventional knife blade (not shown) which pushes the solder through the screen into the holes in plate 15 when tray 35 and screen 37 are lowered onto plate 15 which is seen in the inverted position.

After filling or loading of the holes 17 with solder paste, and retracting the screen, the unit is rotated along the arrows over a circuit board 10. The top plate 16 is moved down to push the pins 18 out of the holes 17, with the solder paste 20 on the ends thereof. When the pins reach the bottom of their downward movement, the paste is deposited on the board. Springs 25 assist in returning the top plate to its raised position relative to the lower plate. The pins 18 are loosely fit in the holes 17 to permit air to be pushed out as the solder paste is filled into the holes. The filling of the holes and ejection of the paste is illustrated quite clearly in FIGS. 4, 5, 6 and 6a, which are to a larger scale.

Normally both top and bottom plates will be raised for applying the solder paste. The two plates would then be lowered, as discussed above, to bring the lower surface 21 of the lower plate into closer proximity to a support surface on which is supported the circuit board. The top plate 16 would then be moved down to eject the solder paste and apply it to the board.

Figure 6:
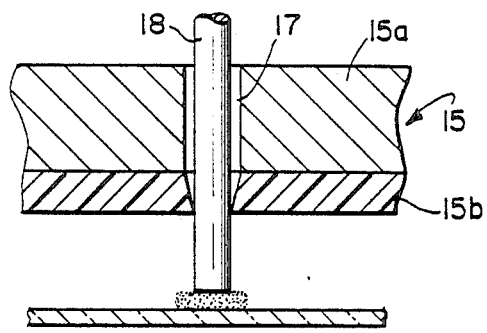
Figure 6A:
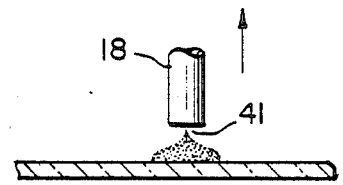
Figure 7:
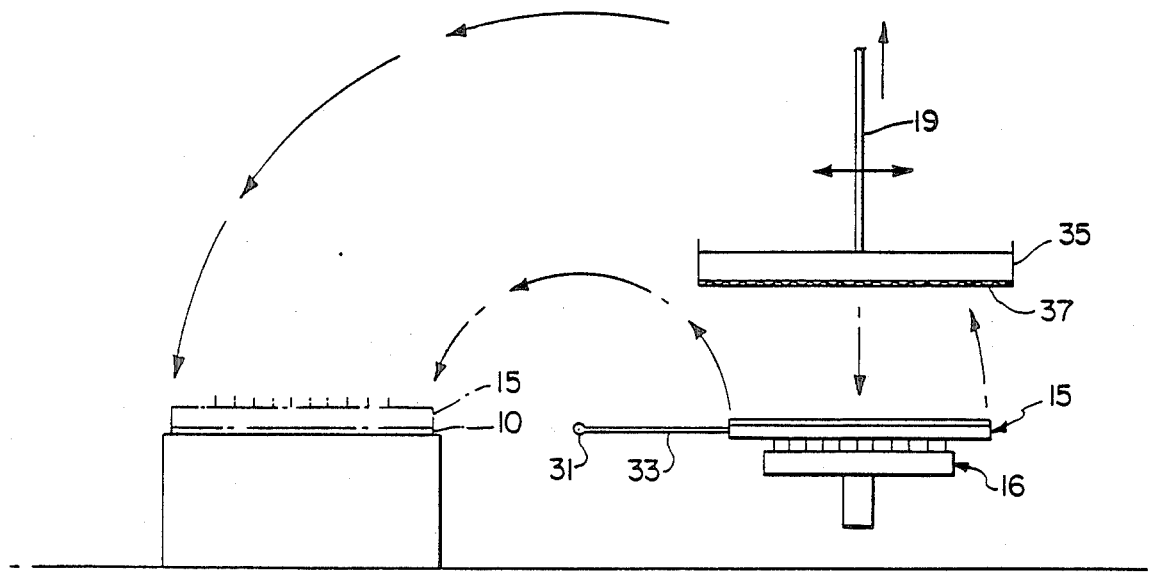
FIG. 7 is a schematic side elevational view of an automatic apparatus according to the invention.

Referring to FIGS. 6 and 6a, it will be seen that the pins do not come all the way down and contact the printed circuit board due to the inherent lack of flatness of the boards. However, 90% of the solder paste is transferred to the printed circuit board. The pins, as seen in FIG. 6, more or less "squash" the paste, and as the pin retracts as seen in FIG. 6a, the solder paste is pulled up roughly into a hemispherical shape with a slight point on the end. This is specifically seen at 41 in FIG. 6a.

Figure 3:
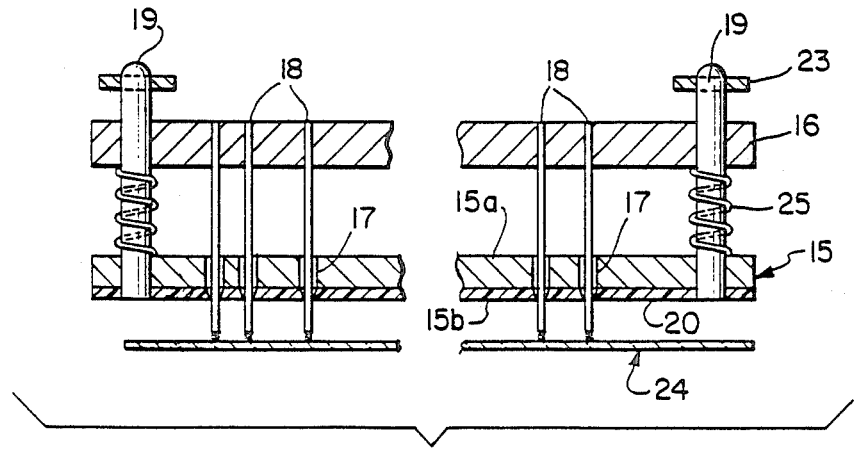
FIG. 3 is a cross-sectional view as in FIG. 2, but showing the apparatus in the ejection position.

In FIGS. 2 and 3, the pins have been shown as extending to the same relative position in each hole; however, it is possible to vary the level of individual pins so as to vary the amount of solder paste filled into each hole and thus vary the amount of solder paste applied to the board. Also, it is possible to vary the position of the top plate relative to the lower plate, in the filling position, as in FIGS. 2 and 3, such as by a moveable stop on each guide member 19, indicated at 23, in FIGS. 2 and 3, and thus determine how much solder paste is filled into the holes. Thus, the amount of solder paste can be varied at different positions for a board and also can be varied from one board to another; both locally and across a whole board.

The arrangement of holes 17 and pins 18 can be varied. Thus, if desired, the bottom or lower plate 15 can be made to suit a particular circuit board or pattern of solder paste dots. For a change in the pattern of dots, a new lower plate will be prepared. A corresponding arrangement of pins 18 will be required, and this can be provided also by a top plate having a predetermined array of pins.

An alternative arrangement, particularly applicable to situations where solder paste dots are deposited on a standard pitch grid, which is normal with semiconductor components, the lower plate can have a complete grid arrangement of holes over its whole area. With this arrangement, solder paste can be applied through a mask which permits the solder paste to fill only those holes from which the paste is to be ejected onto a circuit board. An alternative to applying paste through a mask is to actuate only those pins which are necessary to eject paste at the required positions. Another alternative is to block those holes not required and to omit the pins normally positioned in those holes. It is also feasible that the pins, instead of being actuated directly by the top plate 16, could be actuated individually, as by small solenoids. The pins can be actuated in groups also.

While it is likely that an entire circuit board would be processed at one time, it can be that only a part of a board is done at a time. However, either the pattern of solder paste dots would necessarily be repeated on the board, or the board would need to be fed to a further paste applying machine.

While several embodiments of the invention have been described, it will be understood that it is capable of still further modifications and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. Apparatus for the application of solder paste to a circuit board, comprising:
   (a) a perforated plate, the perforations in the plate being in a predetermined pattern facing in an upward direction;
   (b) means for filling solder paste downwardly into said perforations;
   (c) means for rotating said plate 180° to a location adjacent a circuit board wherein said perforations face downwardly; and
   (d) means for ejecting the solder paste from said perforations onto the circuit board.

2. Apparatus as claimed in claim 1, wherein said means for ejecting the solder paste comprises a pin mounted for axial reciprocation in each of said perforations.

3. Apparatus as claimed in claim 2, wherein said pin has a filling position with its outer end within the aperture and an ejecting position with its outer end extending beyond the surface of the plate, the pin being moveable from said filling position to said ejecting position to eject the solder paste.

4. Apparatus as claimed in claim 3, wherein said filling position is variable.

5. Apparatus as claimed in claim 1, wherein said plate includes a layer of plastic.

6. Apparatus as claimed in claim 1, wherein said plate includes a layer of polytetrafluoroethylene.

7. Apparatus as claimed in claim 1, wherein said means for filling said holes comprising a screen tray with means therein for forcing the solder paste through the screen and being mounted for reciprocation above the front face of said perforated plate.

8. Apparatus as claimed in claim 1, including a pattern of holes comprising a grid, said holes arranged in columns and rows.

9. Apparatus as claimed in claim 1, including pins mounted on a second plate and extending only into those holes in said perforated plate from which solder paste is to be ejected.

10. Apparatus as claimed in claim 1, wherein said holes positioned in said one plate in a pattern conforming to a desired pattern of solder paste dots on the circuit board.

* * * * *